United States Patent
Lu et al.

(10) Patent No.: US 10,475,847 B2
(45) Date of Patent: Nov. 12, 2019

(54) SEMICONDUCTOR DEVICE HAVING STRESS-NEUTRALIZED FILM STACK AND METHOD OF FABRICATING SAME

(71) Applicant: Taiwan Semiconductor Manufacturing Co., Ltd., Hsin-Chu (TW)

(72) Inventors: Chi-Ming Lu, Kaohsiung (TW); Chih-Hui Huang, Tainan County (TW); Sheng-Chan Li, Tainan (TW); Jung-Chih Tsao, Hsin-Chu (TW); Yao-Hsiang Liang, Shinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/231,390

(22) Filed: Aug. 8, 2016

(65) Prior Publication Data
US 2017/0317134 A1    Nov. 2, 2017

Related U.S. Application Data

(60) Provisional application No. 62/329,077, filed on Apr. 28, 2016.

(51) Int. Cl.
*H01L 21/285* (2006.01)
*H01L 21/3205* (2006.01)
*H01L 21/3213* (2006.01)
*H01L 27/146* (2006.01)

(52) U.S. Cl.
CPC .... *H01L 27/14685* (2013.01); *H01L 21/2855* (2013.01); *H01L 21/28556* (2013.01); *H01L 21/32051* (2013.01); *H01L 27/1462* (2013.01); *H01L 27/14636* (2013.01); *H01L 27/14621* (2013.01); *H01L 27/14627* (2013.01)

(58) Field of Classification Search
None
See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,053,856 B1 * | 11/2011 | Tu | H01L 27/14609 257/432 |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |

(Continued)

FOREIGN PATENT DOCUMENTS

| | | |
|---|---|---|
| CN | 101826536 A | 9/2010 |
| CN | 103311101 A | 9/2013 |
| CN | 103579273 A | 2/2014 |

*Primary Examiner* — Jay C Chang
(74) *Attorney, Agent, or Firm* — Haynes and Boone, LLP

(57) ABSTRACT

A method of fabricating a semiconductor device includes forming a first film having a first film stress type and a first film stress intensity over a substrate and forming a second film having a second film stress type and a second film stress intensity over the first film. The second film stress type is different than the first film stress type. The second film stress intensity is about same as the first film stress intensity. The second film compensates stress induced effect of non-flatness of the substrate by the first film.

20 Claims, 11 Drawing Sheets

(56) References Cited

U.S. PATENT DOCUMENTS

| | | | |
|---|---|---|---|
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 2003/0062519 A1* | 4/2003 | Yamazaki | H01L 51/5253 257/40 |
| 2006/0011808 A1* | 1/2006 | Li | H01L 27/14623 250/208.1 |
| 2009/0315067 A1* | 12/2009 | Huang | H01L 21/02458 257/101 |
| 2010/0224766 A1* | 9/2010 | Tateshita | H01L 21/82345 250/214.1 |
| 2012/0193624 A1* | 8/2012 | You | H01L 27/124 257/57 |
| 2012/0280348 A1* | 11/2012 | Chou | H01L 27/14623 257/435 |
| 2013/0048935 A1* | 2/2013 | Gotti | H01L 45/06 257/2 |
| 2014/0001574 A1 | 1/2014 | Chen et al. | |
| 2014/0042576 A1* | 2/2014 | Toyoda | H01L 31/02325 257/432 |
| 2014/0110755 A1 | 4/2014 | Colinge | |
| 2014/0117509 A1* | 5/2014 | Schneegans | C23C 14/14 257/629 |
| 2014/0151812 A1 | 6/2014 | Liaw | |
| 2014/0211057 A1* | 7/2014 | Chien | H04N 5/361 348/308 |
| 2015/0115382 A1* | 4/2015 | Wu | H01L 27/14627 257/432 |
| 2015/0249109 A1* | 9/2015 | Wang | H01L 27/14621 438/70 |
| 2017/0317134 A1 | 11/2017 | Lu et al. | |

* cited by examiner

SEMICONDUCTOR DEVICE HAVING STRESS-NEUTRALIZED FILM STACK AND METHOD OF FABRICATING SAME

PRIORITY DATA

The present application claims priority to U.S. Provisional Patent Application Ser. No. 62/329,077 filed Apr. 28, 2016, entitled "A METHOD OF FORMING SEMICONDUCTOR DEVICE," the entire disclosure of which is hereby incorporated herein by reference.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, challenges arise when adequate flatness of a substrate is not maintained during fabrication.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
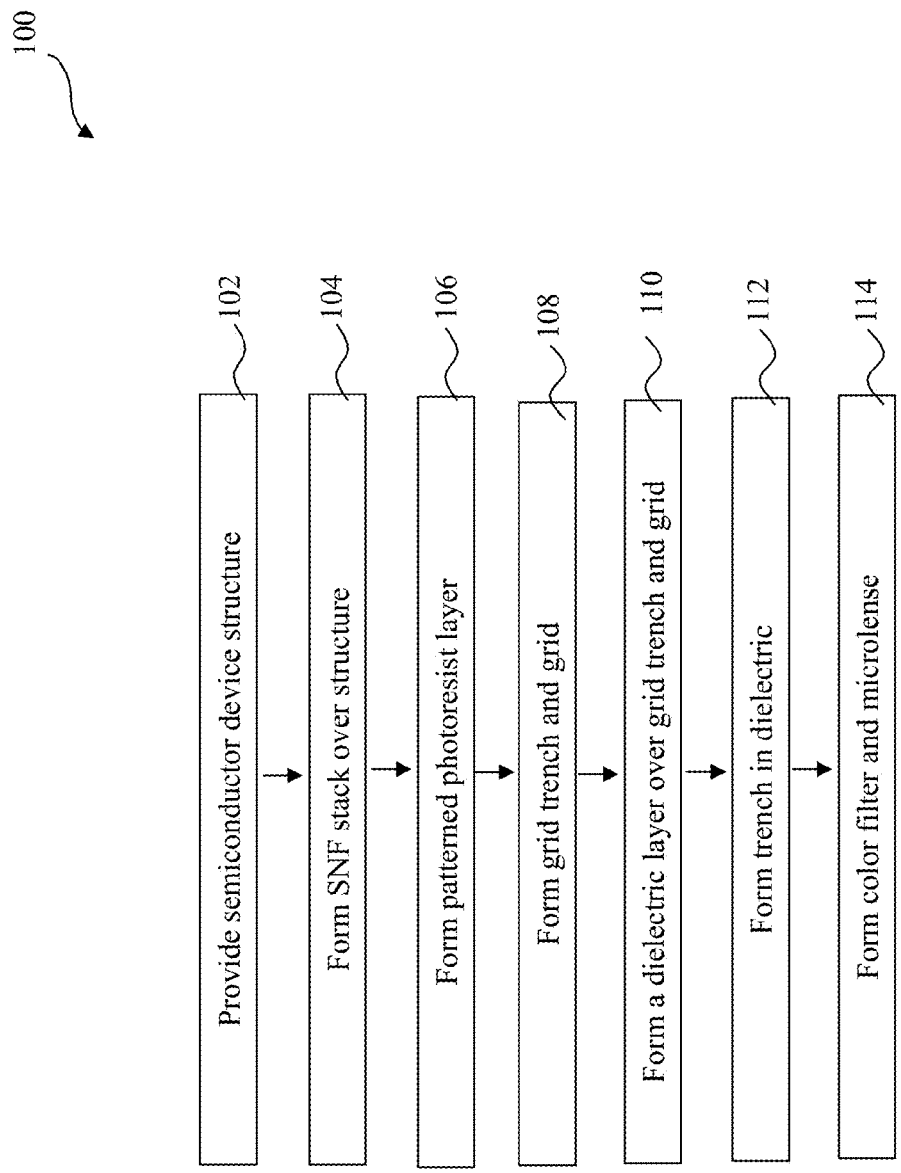
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments of the present disclosure. The method 100 is an example, and is not intended to limit the present disclosure beyond what is explicitly recited in the claims. Additional operations can be provided before, during, and after the method 100, and some operations described can be replaced, eliminated, or relocated for additional embodiments of the method. The method 100 is discussed in detail below, including with reference a semiconductor device 300 shown in FIG. 2 and processed in accordance with FIGS. 3A through 8. The method 100 may further be applied, in part, to form the semiconductor device 900 illustrated in FIG. 9.

As will be shown, the semiconductor device 300 includes an image sensor device. This does not necessarily limit the embodiments to any types of devices, any number of devices, any number of regions, or any configuration of structures or regions beyond what is specifically claimed. For example, the provided subject matter can be applied in fabricating planar field-effect transistor (FET) devices, Fin-FET devices, multi-gate FET devices and a microelectro mechanical system (MEMS) device. Furthermore, the semiconductor device 300 may be an intermediate device fabricated during the processing of an IC, or a portion thereof, that may comprise static random access memory (SRAM) and/or other logic circuits, passive components such as resistors, capacitors, and inductors, and active components such as p-type FETs (PFETs), n-type FETs (NFETs), metal-oxide semiconductor field effect transistors (MOSFET), complementary metal-oxide semiconductor (CMOS) transistors, bipolar transistors, high voltage transistors, high frequency transistors, other memory cells, and combinations thereof.

Referring to FIG. 1, the method 100 starts at step 102 by receiving or providing a semiconductor device. It is noted that FIGS. 2-6 are used an exemplary embodiment in particular directed to a device having two substrates bonded together an including an image sensor. However, one will appreciate that the present methods and devices may also be applied to different substrates, including bonded substrates and single substrates. For example, in an embodiment, the SNF stack discussed in detail below is formed on a semiconductor substrate (e.g., backside) having one or more semiconductor devices formed thereon. This substrate may be bonded to another structure, or may be a single stand-alone substrate when the layers are applied.

Figure 2:
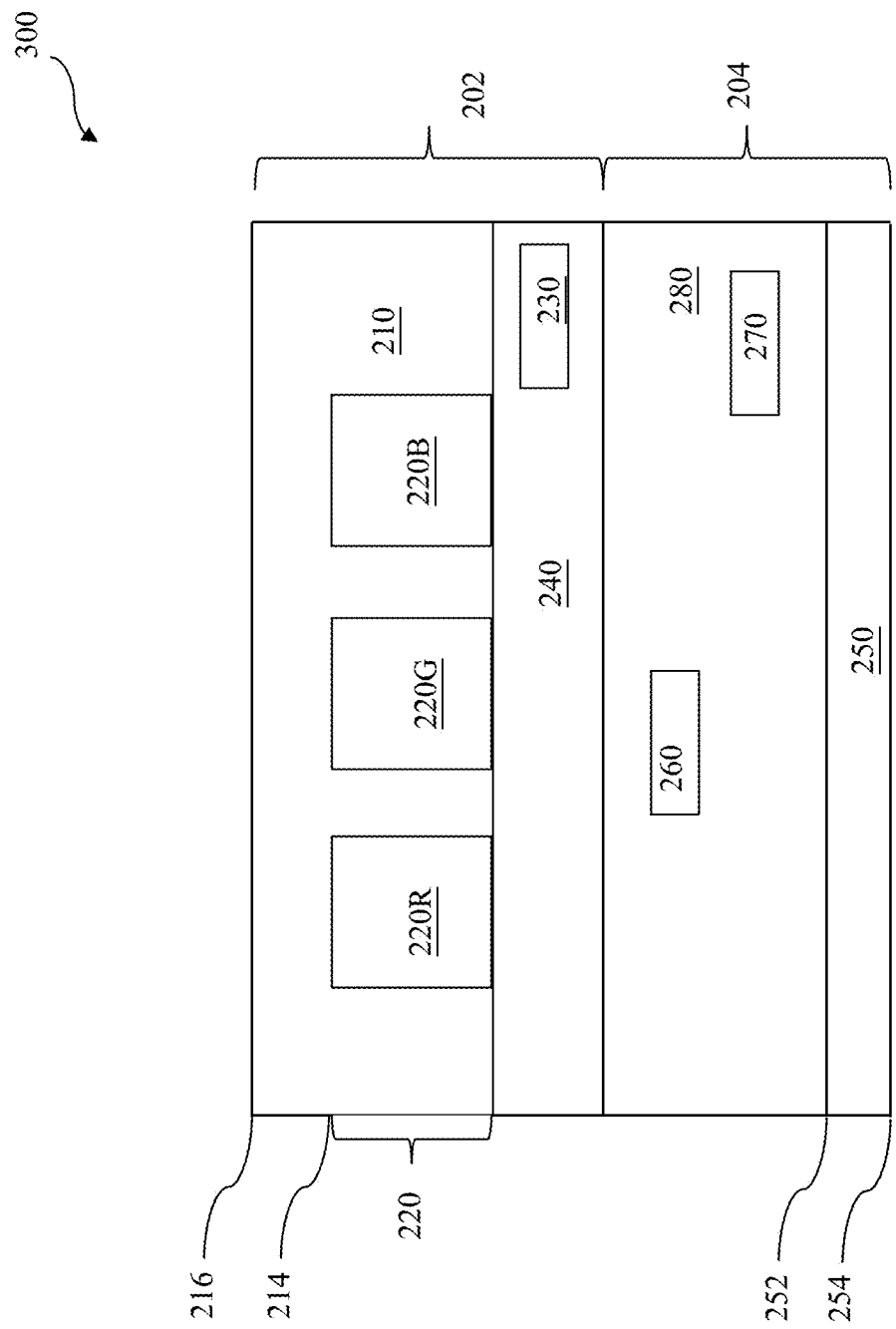
FIG. 2 is a cross-sectional view of a structure in accordance with some embodiments.

Using FIG. 2 as exemplary, a semiconductor device 300 is provided. The initial structure 300 may include a first semiconductor device structure 202 stacked on top of a second semiconductor device structure 204. In some embodiments, the first semiconductor device structure 202 and/or the second semiconductor device structure 204 are in wafer-form. In some embodiments, the first semiconductor device structure 202 and/or the second semiconductor device structure 204 have been previously diced into individual components (e.g., die).

In an embodiment, the first semiconductor structure 202 includes an image sensor, such as a backside illuminated image sensor (BSI), a complementary metal-oxide-semiconductor (CMOS) image sensor (CIS), a charge-coupled device (CCD), an active-pixel sensor (APS), or a passive-pixel sensor. An image sensor may be fabricated by complementary metal-oxide semiconductor (CMOS) process techniques known in the art. In an embodiment, the second semiconductor device structure 204 includes a semiconductor device such as a transistor, capacitor, resistive element, micro-electromechanical system (MEMS) device, and/or other semiconductor devices. In an embodiment, the second semiconductor device structure 204 includes an application-specific integrated circuit (ASIC) device. In an embodiment, the second semiconductor device structure 204 is a carrier substrate or wafer. In an embodiment, the carrier substrate is glass.

The first and second semiconductor device structures, 202 and 204, may be bonded together through suitable bonding techniques such as direct bonding. In accordance with some embodiments, in a direct bonding process, the connection between the first and second semiconductor device structures, 202 and 204, can be implemented through metal-to-metal bonding (e.g., copper-to-copper bonding), dielectric-to-dielectric bonding (e.g., oxide-to-oxide bonding), metal-to-dielectric bonding (e.g., copper-to-oxide bonding), or any combination thereof. In some embodiments, the first and second semiconductor device structures, 202 and 204, are connected to each other through suitable three-dimensional structure. An adhesion layer may also be used in the bonding process. Additionally, a thinning process may be performed to thin either or both semiconductor structures. The thinning process may include a mechanical grinding process and/or a chemical thinning process, for example, applied to a surface (e.g., back surface) of the structures prior to or after bonding.

The first semiconductor device structure 202 may include a substrate 210 having a front surface 214 and a back surface 216 (an upside-down position is shown in FIG. 2, however it is noted that all relative terms in the present disclosure do not imply an absolute direction but merely used for ease of reference and describing a relational configuration). In an embodiment, the substrate 210 includes a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible examples of the substrate 210 also include a silicon-on-insulator (SOI) substrate. SOI substrates are fabricated using separation by implantation of oxygen (SIMOX), wafer bonding, and/or other suitable methods. Thus, in some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary substrate 210, the insulator layer is a component (e.g., layer) of a silicon-on-insulator substrate.

The substrate 210 may include various features formed on and/or in the substrate (e.g., on and/or in the bulk silicon substrate or SOI substrate). For example, the substrate 210 may include various doped regions. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type MOS transistor device and regions configured for a p-type MOS transistor device. The substrate 210 may also include various isolation features. The isolation features separate various device regions in the substrate 210. The isolation features may include different structures formed by using different processing technologies. For example, the isolation features include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The components discussed above on the first semiconductor device structure 202 may be included in various passive and active microelectronic components disposed on and/or in the first semiconductor device structure 202. These components may include image sensor elements 220 (also referred to as pixels) and corresponding circuit elements 230. In an embodiment, the circuit elements 230 include peripheral circuit elements disposed on the first semiconductor device structure 202. The sensor elements 220 detect intensity (brightness) of a radiation directed toward the back surface 216 of the substrate 210. In FIG. 2, the sensor elements 220 are configured to correspond with a specific light wavelength, such as a red (R), a green (G), or a blue (B) light wavelength. In other words, the sensor elements 220 are configured to detect intensity (brightness) of a particular light wavelength. In some embodiments, the sensor elements 220 configured as pixels in a pixel array.

The sensor elements 220 may include photodetectors, such as photodiodes, that includes light sensing regions (or photo-sensing region) 220R, 220G, and 220B which detect intensity (brightness) of red, green, and blue light wavelengths, respectively. The light sensing regions (or photo-sensing regions) 220R, 220G, and 220B may include doped regions having n-type and/or p-type dopants formed in the substrate 210. In some embodiments, the light sensing regions 220R, 220G, and 220B are n-type doped regions, formed by a method such as diffusion and/or ion implantation.

The sensor elements 220 further include various transistors, such as a transfer transistor, a reset transistor, a source-follower transistor, a select transistor, other suitable transistors, or combinations thereof. The various transistors may include P-channel field effect transistors (PFETs), N-channel FETs (NFETs), metal-oxide semiconductor field effect transistors (MOSFETs), CMOS transistors, FinFETs, high voltage transistors, high frequency transistors, bipolar junction transistors, and/other suitable devices. The light sensing regions 220R, 220G, and 220B and various transistors (which can collectively be referred to as pixel circuitry) allow the sensor elements 220 to detect intensity of the particular light wavelength. Additional circuitry, input, and/or outputs may be provided to the sensor elements 220 to provide an operation environment for the sensor elements 220 and/or support communication with the sensor elements 220. This circuitry may be considered in the pixel or in a peripheral region of the substrate 210.

FIG. 2 illustrates an exemplary transistor element 230. The transistor element 230 may be representative of the transistors of the pixel circuitry discussed above, and/or be representative of a peripheral circuit element. A peripheral circuit element may include one or more field effect transistors. For example, the peripheral circuitry elements include P-channel field effect transistors (PFETs), N-channel FETs (NFETs), metal-oxide semiconductor field effect transistors (MOSFETs), CMOS transistors, FinFETs, high voltage transistors, high frequency transistors, bipolar junction transistors, resistors, capacitors, diodes, fuses, other suitable devices, and/or combinations thereof. In some embodiments, the peripheral circuit elements are operable to interface with or control the image sensor elements 220. In one example, a peripheral circuitry area includes peripheral circuit elements that are not physically located within a pixel array area including the image sensor elements and, instead, borders a periphery of a semiconductor die, on which, image sensor elements 220 are fabricated.

The semiconductor device structure 202 may include a dielectric layer (e.g., inter-level dielectric (ILD)) layer 240 formed over the front surface 214 of the substrate 210 for electric isolation purpose. The ILD layer 240 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, amorphous fluorinated carbon, Parylene, polyimide, other suitable material, and/or combinations thereof. Common methods for forming the ILD layer 240 include thermal oxidation, chemical vapor deposition (CVD), high-density plasma CVD (HDP-CVD), physical vapor deposition (PVD), atomic layer deposition (ALD), spin-on deposition, and/or other suitable deposition processes. In an embodiment, the ILD layer 240 may include multiple layers made by different dielectric materials including those discussed above.

The first semiconductor device structure 202 may also include interconnection features (not shown) formed over the substrate 210 and configured to properly connect various features formed in or on the substrate 210, resulting in a functional designed circuit. For example, the interconnection features include multi-layer interconnect (MLI) having horizontal metal lines formed on multiple metal layers and contact/via features to vertically connect metal lines of different metal layers or metal line lines to the substrate 210. In an embodiment, the interconnection features are formed in the ILD layer 240.

Additional features can be incorporated into the first semiconductor device structure 202 and some of the features described above can be replaced or eliminated for other embodiments of the first semiconductor device structure 202.

The second semiconductor device structure 204 can include similar or different elements, as compared to the first semiconductor device structure 202. For example, in an embodiment, the second semiconductor device structure 204 may include a substrate 250 with surfaces, 252 and 254, a primary element 260, a peripheral element 270 and dielectric layers 280. Additional features can be incorporated into the second semiconductor device structure 204 and some of the features described above can be replaced or eliminated for other embodiments of the second semiconductor device structure 204. In an embodiment, the second semiconductor device structure 204 is omitted. It is noted that the second semiconductor device structure 204 may in fact in some embodiments not include a semiconductor device (e.g., handling wafer).

In an embodiment, one or more material layers (referred to as a stack of material layers) are formed over the back surface 216 of the substrate 210. Depending on material layers' type, thickness, and receiving conditions during material layer formations, the composite stress of the material layer(s) may be compressive or tensile. Introduction of this stress can lead the device 300 and/or the semiconductor device structure 202 to have an unacceptable non-flatness (e.g., convex shape, concave shape or other distortion). The non-flatness may cause adverse effects in subsequent processes, such as an overlay error in the subsequent lithography patterning process to pattern the material layer(s). The overlay is the relative position between two or more layers of a semiconductor substrate such as, for example, a wafer. As semiconductor processes evolve to provide for smaller critical dimensions, and devices reduce in size and increase in complexity including number of layers, the alignment precision between layers becomes increasingly more important to the quality, reliability, and yield of the devices. Thus, the present disclosure provides a method to form a stress-neutralized film pair (or a film stack) to reduce film-formation-stress induced non-flatness of the semiconductor device 300.

Figure 3A:
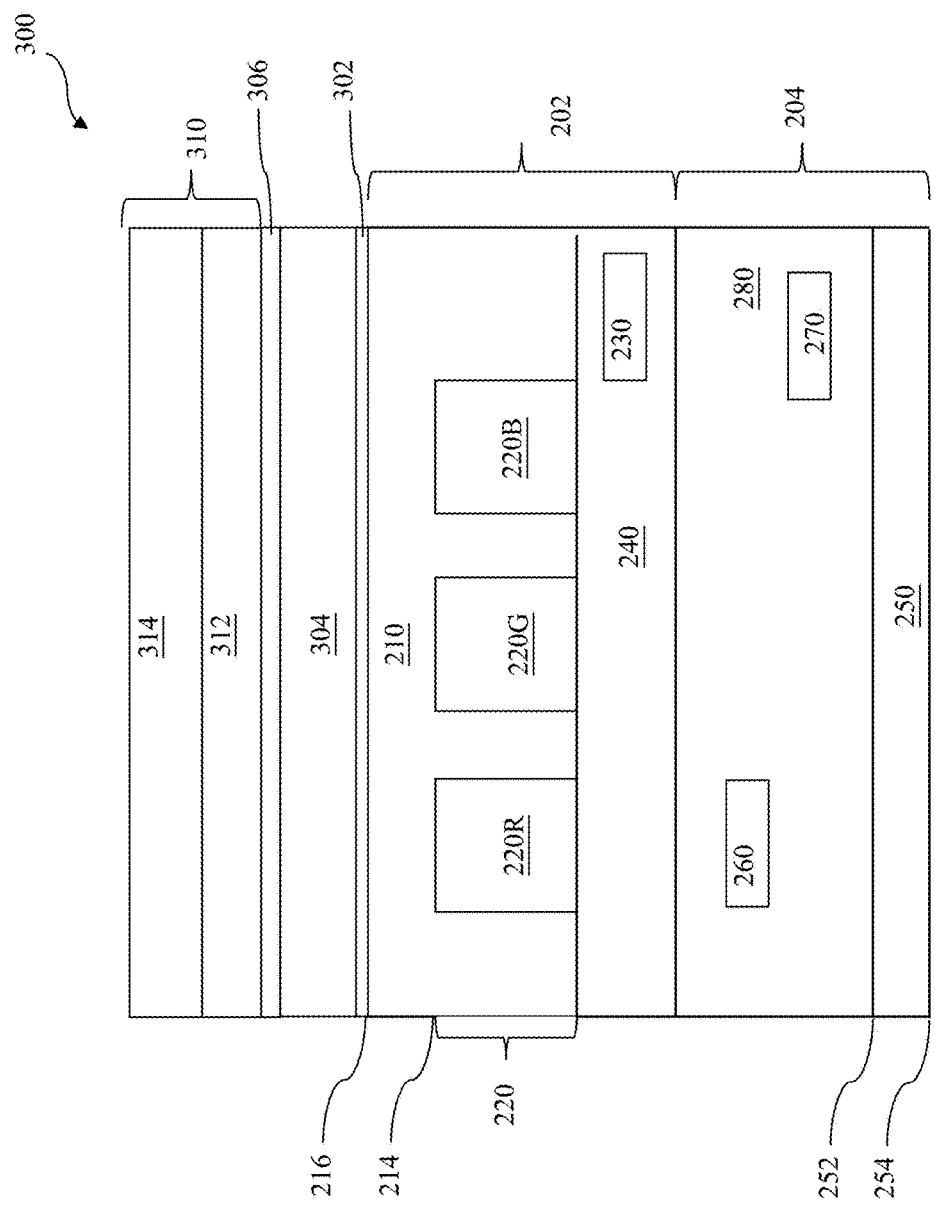
FIG. 3A is a cross-sectional view of an example semiconductor device in accordance with some embodiments.

Referring to FIGS. 1 and 3A, the method 100 then proceeds to step 104 where a stress-neutralized film (SNF) stack 310 is formed over the back surface 216 of the substrate 210. In the present embodiment, the SNF stack 310 includes a first film 312 (or a first group of films) and a second film 314 (or a second group of films). The first film 312 has a first type of film stress and a first film stress intensity (also referred to as a stress value), while the second film 314 has a second type of film stress and a second film stress intensity (also referred to as a stress value). The second type of film stress is different than the first type of film stress; particularly, the second type of film stress is opposite of the first type of film stress. For example, in an embodiment, one of the first film 312 and the second film 314 has/provides a compressive stress and another one of the first film 312 and the second film 314 has/provides is tensile stress. In one embodiment, the first type of film stress has compressive stress, while the second type of film stress is tensile stress. In an embodiment, the stress is provided by force/area represented by a number (or value) and a direction (e.g., +/−). The stress (force per area) for the first film 312 may be a positive value (number) x; the stress (force per area) for the second film 314 may be a negative value (number) x, where positive is tensile stress and negative is compressive stress and x is the value of the stress (e.g., force/area). For example, x may be a value in MPa. In an embodiment, the value (also referred to as intensity) of stress of the first and second films 312 and 314 are numbers within 10 percent, while the sign (or direction) is opposite (e.g., + and − respectively). In an embodiment, the intensity (or value) of stress of the first and second films 312 and 314 are substantially the same, while the sign (or direction) is opposite (e.g., + and − respectively). Substantially the same intensity includes those intensities that are exactly the same and within a few percent variation (e.g., <5%).

In the present embodiment, type, thickness and receiving conditions during formations of the first and second films, 312 and 314, is controlled such that, the value of the second film stress intensity is about same as the value of first film stress intensity, but in an opposite direction. In other words, the second film stress compensates (or neutralizes) the first film stress. As a result, the SNF stack is formed with minimized stress-induced adverse impacts on flatness of the semiconductor device 300.

Thus, in an embodiment, there may be a stress exhibited onto the surface 216 of the device 202 from the deposition of the first film (e.g., 312) prior to the deposition of the second film (e.g., 314). This stress exhibited onto the surface 216 is then reduced or in some embodiments eliminated, upon the deposition of the second film (e.g., 314). Some embodiments this is because the opposite type of stress of the second film serves to neutralize the stress provided by the first film.

The SNF stack 310 may be made by conductive materials, dielectric materials, and/or other suitable material. Examples of a conductive material may include tungsten (W), copper, copper alloy, copper magnesium (CuMn), copper aluminum (CuAl), copper silicon (CuSi), aluminum (Al), and/or other suitable metal material. Examples of a dielectric material may include silicon nitride, silicon carbide, and/or other suitable material. The SNF stack 310 may be formed by PVD, CVD, ALD, electroplating, and/or a combination thereof.

In some embodiments, the first and second films, 312 and 314, are same material formed by different deposition techniques. In an embodiment, the SNF stack 310 includes a pair of metal layers.

In an embodiment, the SNF stack 310 includes is a first tungsten (W) layer 312 formed by a first method and a second W layer 314 formed by a second method. In an embodiment, the first method is one of PVD and CVD and the second method is the other one of PVD and CVD. In an embodiment, the PVD W layer 312 has compressive stress and the CVD W layer 314 has tensile stress. By choosing conditions of film deposition and thickness, the film stress intensity or value of the PVD W layer 312 is provided to be substantially similar to the film stress intensity or value of the CVD W layer 314, the intensities of stress being provided in the opposite direction (+/−). In one embodiment, a thickness of the CVD W layer 314 is as same as the PVD W layer 312. For example, the thickness may be about 1000 Å.

In one embodiment, the PVD W layer 312 is deposited over the back surface 216 of the substrate 210 and the CVD W layer 314 is deposited over the PVD W layer 312. In a further embodiment, there is a direct interface between layer 312 and layer 314. In another embodiment, the CVD W layer 314 is deposited over the back surface 216 of the substrate 210 and the PVD W layer 312 is deposited over the CVD W layer 314. Again in a further embodiment, there is a direct interface between the layers 312 and 314.

Figure 3B:
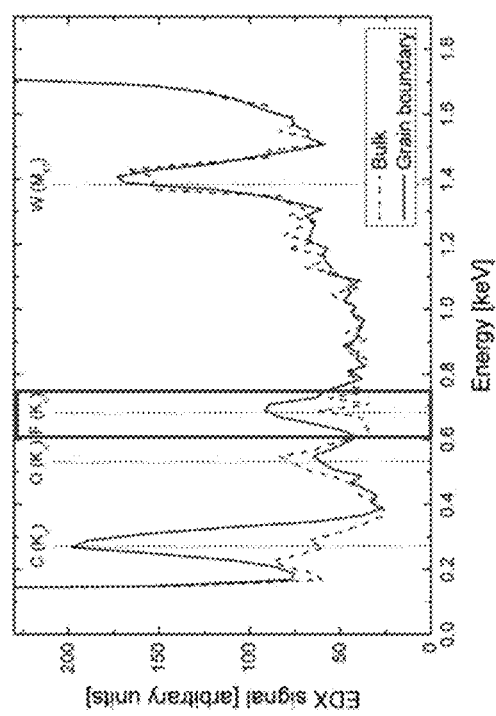
FIG. 3B is an energy-dispersive X-ray spectroscopy (EDX) spectrum, constructed according to various embodiments in accordance with some embodiments.
Figure 4:
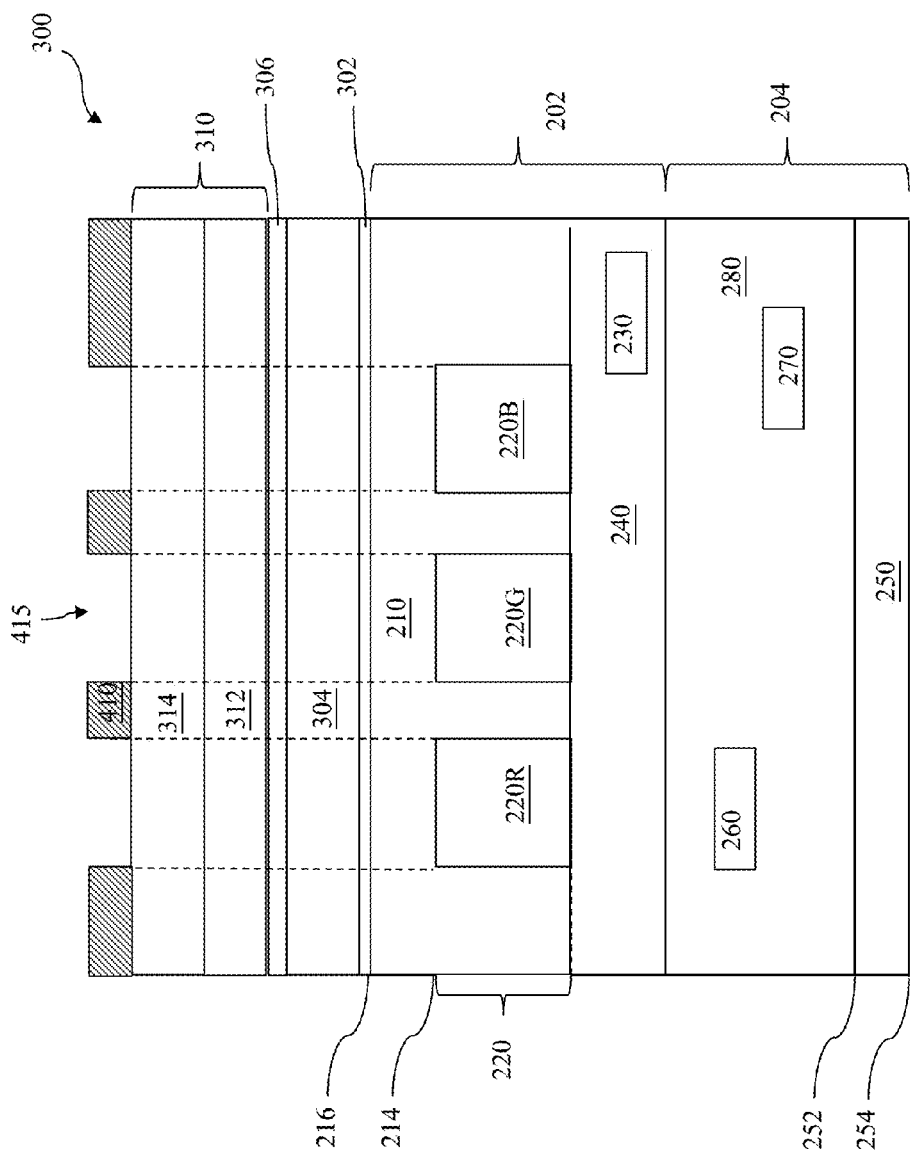
FIGS. 4, 5A, 5B, 6, 7 and 8 are cross-sectional views of an example semiconductor device in accordance with some embodiments.

In an embodiment, one of the layers 312 or 314 is a tungsten layer formed using CVD. The CVD W layer (e.g., 314) is formed by using tungsten hexafluoride ($WF_6$) precursor. As a result, the resultant CVD W layer has a composition including fluorine. This is illustrated by the fluoride peak shown in an energy-dispersive X-ray spectroscopy (EDX) spectrum, illustrated in FIG. 3B. In FIG. 3B, the horizontal axis is the energy (Kev), the vertical axis is the EDX signal and fluoride peak shows at about 0.677 Kev labeled in the legend as "F(K)".

Alternatively, in some embodiments, the first and second films, 312 and 314, are different materials. The materials (their thicknesses, their deposition methods) may be selected to provide similar intensity or value of stress, but in opposite directions as discussed above.

Referring again to FIG. 3A, in some embodiments, prior to forming the SNF stack 310, an anti-reflection coating (ARC) layer 302 is formed over the back surface 216 of the substrate 210 and a dielectric layer 304 is formed over the BARC layer 302. In an embodiment, such as where the SNF stack 310 includes metal layers, a barrier layer 306 is formed over the dielectric layer 304 to prevent inter-diffusion and reactions with the SNF stack 310. The ARC layer 302 may include a nitride material, an organic material; an oxide material and/or the like. The dielectric layer 304 may include silicon oxide, silicon oxynitride, and/or other suitable dielectric layer. The barrier layer 306 may include titanium (Ti), titanium nitride (TiN), tantalum nitride (TaN), tungsten nitride (WN), titanium silicon nitride (TiSiN) or tantalum silicon nitride (TaSiN). One or more of the layers 302, 304 and 306 may be formed by PVD, CVD, metal-organic chemical vapor deposition (MOCVD) and ALD, and/or other suitable technique Referring to FIGS. 1 and 4, method 100 proceeds to step 106 by forming a patterned photoresist layer 410 over the SNF stack 310. The patterned photoresist layer 410 has a plurality of openings 415 and each of the opening 415 aligns to a respective light sensing region, 220R, 220G, and 220B. In some embodiments, the patterned photoresist layer 410 is formed by a lithography process. An exemplary lithography process may include forming a photoresist layer, exposing the photoresist layer by a lithography exposure process, performing a post-exposure bake process, and developing the photoresist layer to form the patterned resist layer.

As has been mentioned previously, it is desired to form a patterned photoresist layer over a substrate having an acceptable flatness to reduce overly error. In that regard, the SNF stack is formed with minimized stress-induced adverse impacts on flatness of the semiconductor device 300. This in turn, an overlay error (between the opening 415 and the light sensing region 220R, or 220G, or 220B) induced by non-flatness of the semiconductor device 300 is minimized.

Figure 5A:
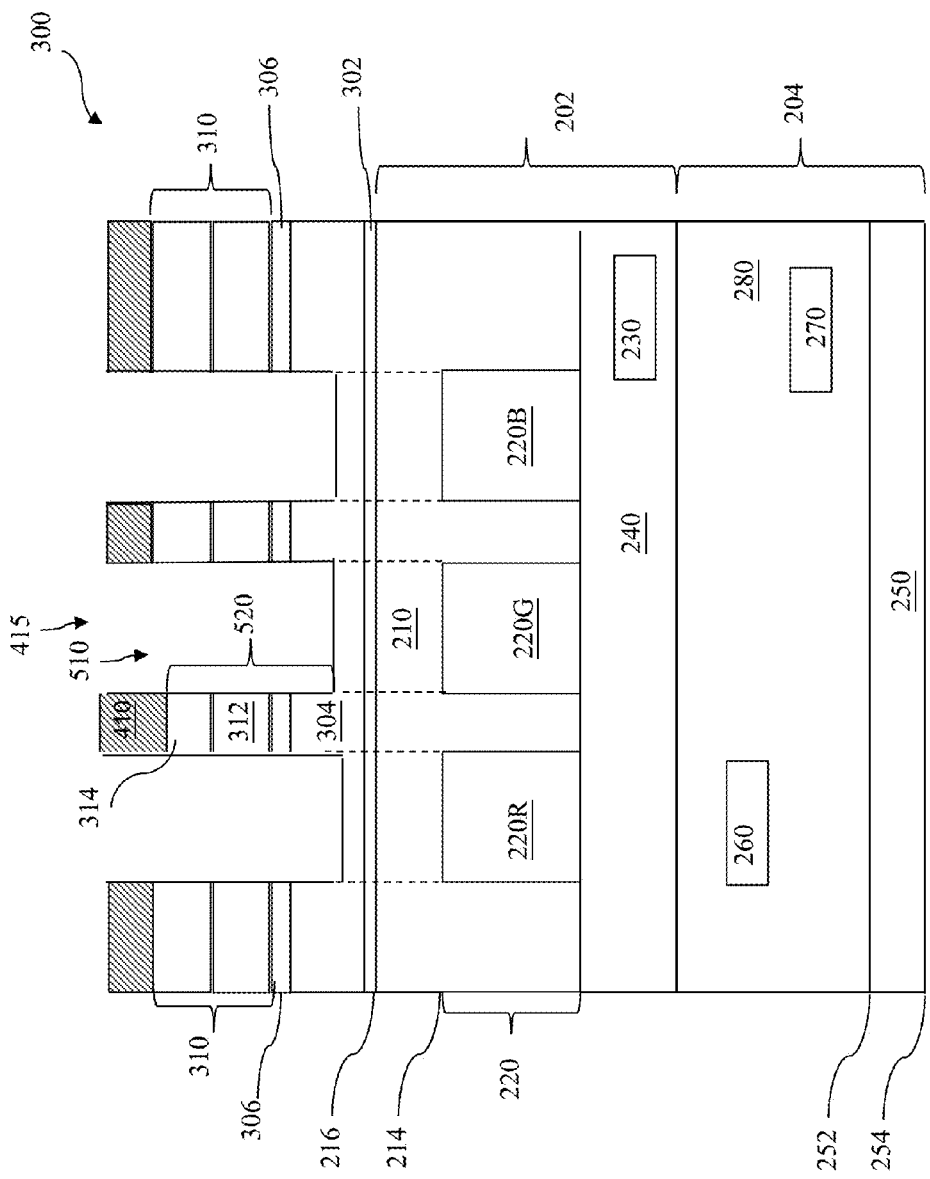

Referring to FIGS. 1 and 5A, method 100 proceeds to step 108 where the SNF stack 310 is etched to form grid trenches 510 and grids (or pillar) 520. In embodiment including additional layers, the additional layers may also be etched. For example, the barrier layer 306 and a portion of the first dielectric layer 304 may be etched to form the grid trenches 510 and grids 510 through the openings 415. In some embodiments, each of grid trenches 510 aligns (vertically) to a respective light sensing region, 220R, 220G and 220B. For example, the grid trench 510 is formed such that the respective light sensing region is aligned within the boundaries of the trench 510.

The etch process for forming the grid trenches may include a wet etch, a dry etch, and/or a combination thereof. The etch process may include a dry etch, a wet etch, and/or a combination thereof. For an example, a dry etch process may implement a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As another example, a wet etching process may comprise etching in diluted hydrofluoric acid (DHF); potassium hydroxide (KOH) solution; ammonia; a solution containing hydrofluoric acid (HF), nitric acid ($HNO_3$), acetic acid (CH₃COOH); a standard clean solution (SC1) having NH₄OH, H₂O₂ and H₂O and/or other suitable wet etchant. In some embodiments, a depth of etch is controlled that a portion of the dielectric layer 304 remains as a bottom portion of the grid trench 520. The grid trenches 520 are etched using the patterned photoresist and/or associated hard mask layers as masking elements.

Figure 5B:
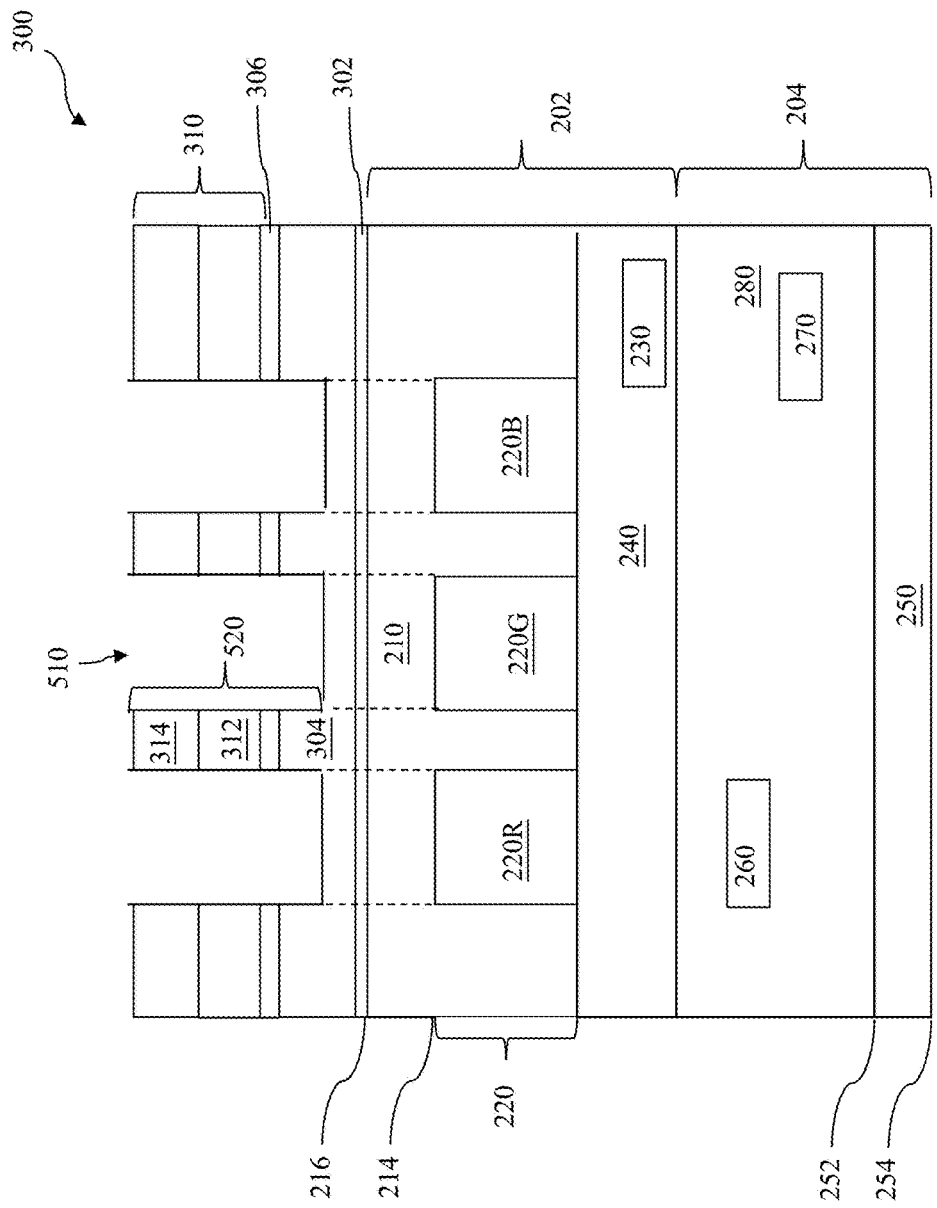

After forming grid trenches 510 and grids 520, the patterned photoresist layer 410 is removed by a proper process, such as wet stripping and/or plasma ashing, as shown in FIG. 5B. As a result, in an exemplary embodiment, the grid 520 is formed such that it has the first dielectric layer 304 as its bottom portion, the SNF stack 310 as its upper portion.

Figure 6:
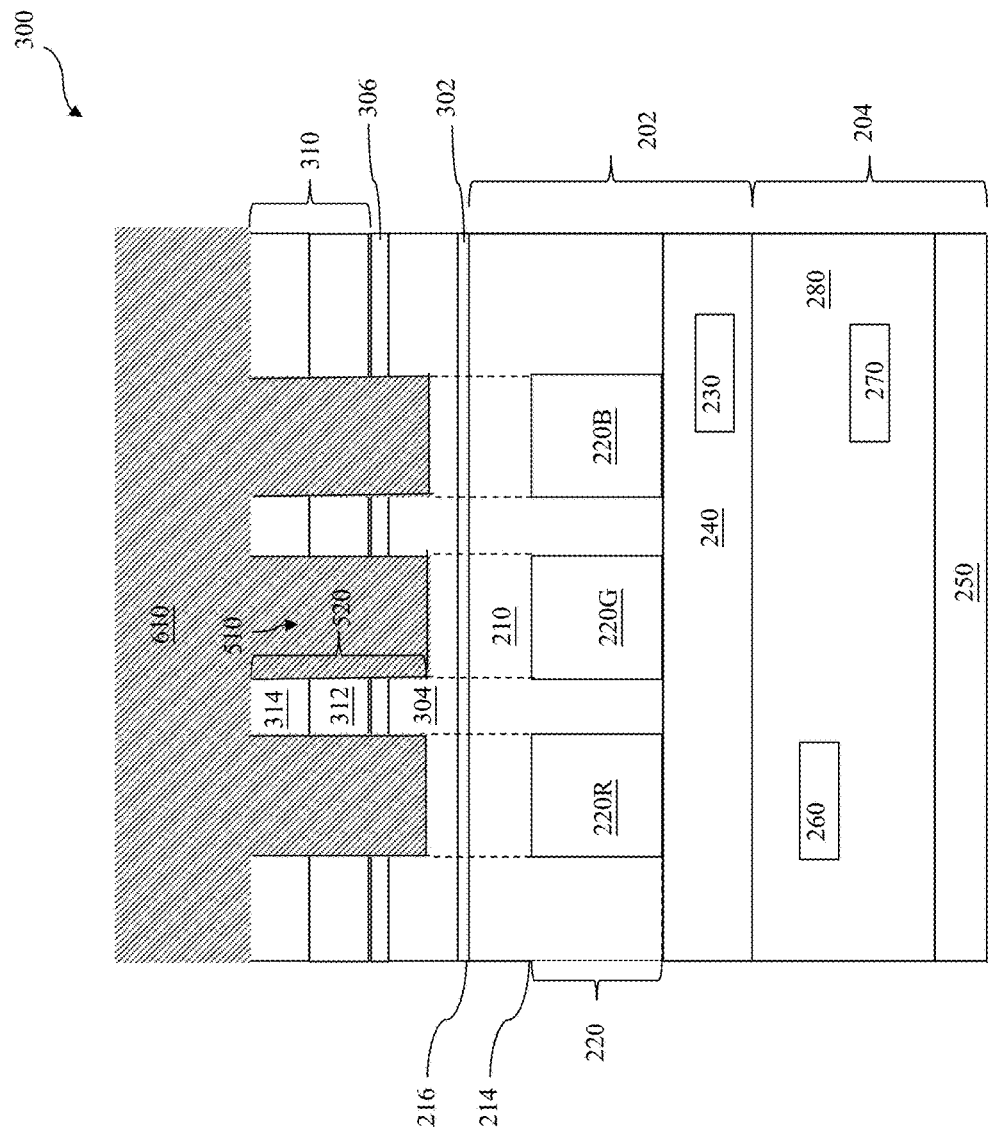

Referring to FIGS. 1 and 6, method 100 then proceeds to step 110 where the grid trench 510 is filled with a dielectric layer 610. The dielectric layer 610 can extend above the grid trench 510, including over above the grids 520. The dielectric layer 610 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, amorphous fluorinated carbon, Parylene, polyimide, other suitable material, and/or combinations thereof. The dielectric layer 610 may also include high-k dielectric materials, such as HfO₂, HfSiO, HfSiON, HfTaO, HfTiO, HfZrO, zirconium oxide, aluminum oxide, hafnium dioxide-alumina (HfO₂—Al₂O₃) alloy, other suitable high-k dielectric materials, and/or combinations thereof. The dielectric layer 610 may be deposited by CVD, PVD, ALD, spin-on deposition, and/or other suitable deposition processes.

Figure 7:
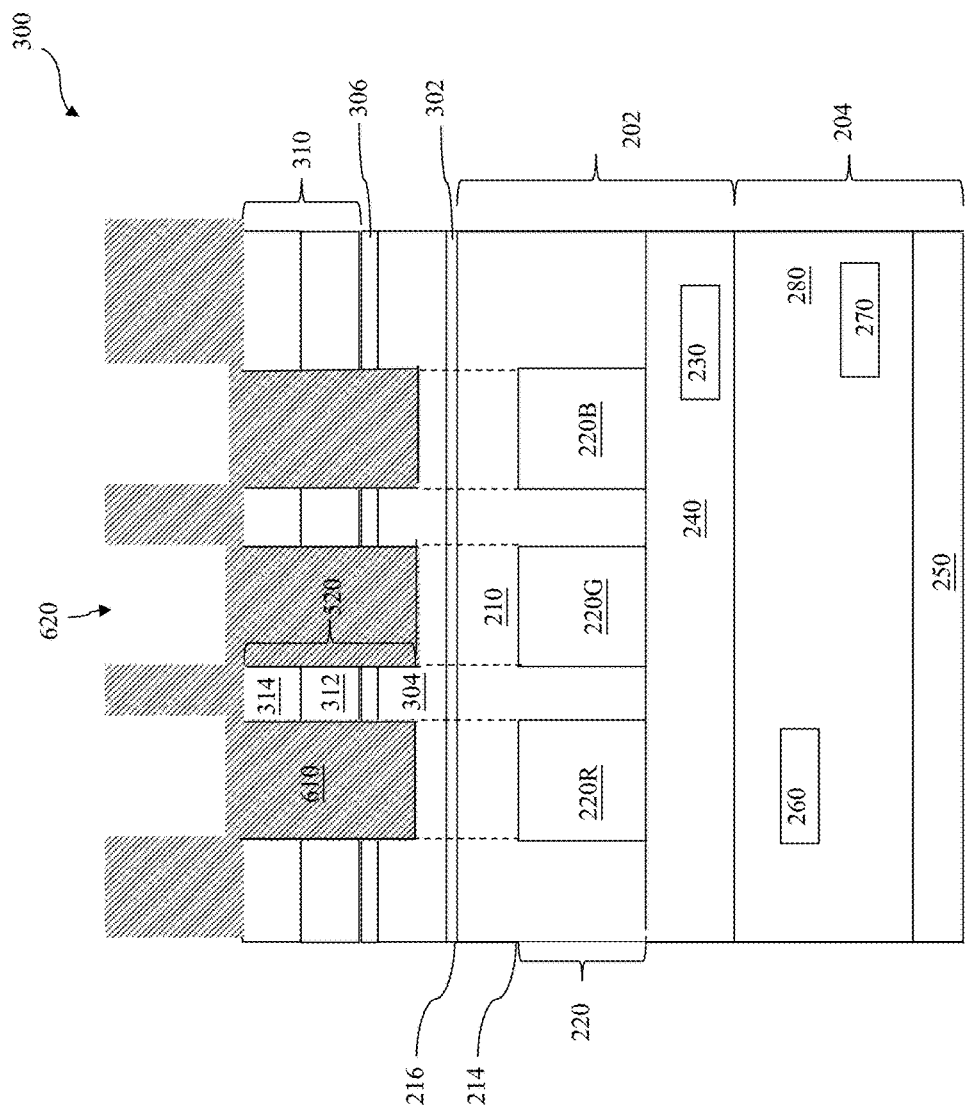

Referring to FIGS. 1 and 7, method 100 proceeds to step 112 by forming trenches 620 within the dielectric layer 610. In an embodiment, the trenches 620 align (vertically) to respective light sensing regions, 220R, 220G and 220B. In some embodiments, the trenches 620 are formed by forming a patterned photoresist layer over the dielectric layer 610 and then etching the dielectric layer 610 through the patterned photoresist layer. In an embodiment, a depth of etch is controlled that a portion of the dielectric layer 610 remains as a bottom portion of the dielectric trench 620. The etch process may include a wet etch, a dry etch, and/or a combination thereof.

Figure 8:
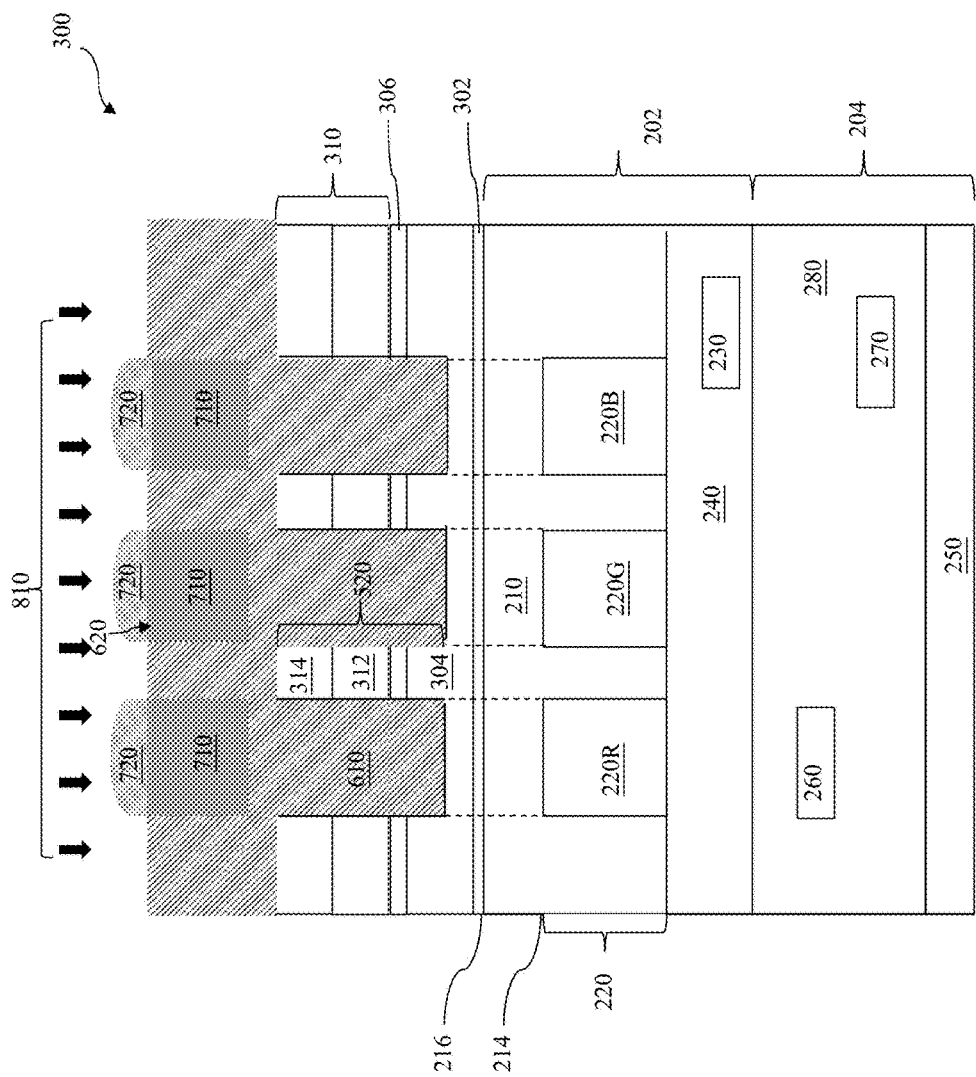

Referring to FIGS. 1 and 8, method 100 proceeds to step 114 by forming color filters 710 and microlenses 720 over the back surface 216 of the substrate 210. In some embodiments, each of the color filters 710 aligns with the respective light sensing regions 220R, 220G, and 220B. The color filters 710 are designed so that each filters through light of a predetermined wavelength. For example, the color filter 710 aligned with the light sensing region 220R may be configured to filter through visible light of a red wavelength to the light sensing region 220R; the color filter 710 aligned with the light sensing region 220G may be configured to filter through visible light of a green wavelength to the light sensing region 220G; or the color filter 710 aligned with the light sensing region 220B may be configured to filter through visible light of a blue wavelength to the light sensing region 220B. The color filters 710 include any suitable material. In an example, the color filters 710 include a dye-based (or pigment-based) polymer for filtering out a specific frequency band (for example, a desired wavelength of light). Alternatively, the color filters 710 may include a resin or other organic-based material having color pigments.

In the present embodiment, the microlenses 720, disposed over the back surface 216 of the substrate 210, align with respective light sensing regions 220R, 220G, and 220B of the sensor elements 220. In some embodiments, the microlenses 720 are disposed over the color filters 710. The microlenses 720 may be in various positional arrangements with the sensor elements 220 and color filters 710, such that the microlens 720 focuses an incoming incident radiation on the respective light sensing regions 220R, 220G, and 220B of the sensor elements 220. The microlenses 720 include a suitable material, and may have a variety of shapes and sizes depending on an index of refraction of the material used for the microlens and/or a distance between the microlens and sensor elements 220. Alternatively, the position of the color filters 710 and microlens 720 may be reversed, such that the microlenses 720 are disposed between the back surface 216 of the substrate 210 and color filters 710. In present embodiment, the color filter 710 and the microlense 720 are formed by a suitable process, such as deposition and patterning.

Referring again to FIG. 8, in operation, the semiconductor device 300 is designed to receive a radiation 810 traveling towards the back surface 216 of the substrate 210. In the depicted embodiment, the incident radiation 810 is visual light. Alternatively, the radiation 810 could be infrared (IR), ultraviolet (UV), X-ray, microwave, other suitable radiation type, or combinations thereof. The microlenses 720 direct the incident radiation 810 to the respective color filters 710. The light then passes through the color filters 710 to a corresponding sensor element 220, specifically to respective light sensing regions 220R, 220G, and 220B. The desired wavelengths of light (for example, red, green, and blue light) are more efficiently allowed to pass through to the respective light sensing regions 220R, 220G, and 220B of the sensor elements 220. When exposed to the light, the light sensing regions 220R, 220G, and 220B of the sensor elements 220 produce and accumulate (collect) electrons, which may be converted to voltage signals.

The semiconductor device 300 may include additional features, which may be formed by subsequent processing. Additional steps can be provided before, during, and after the method 100, and some of the steps described can be replaced, eliminated, or moved around for additional embodiments of the method 100.

Figure 9:
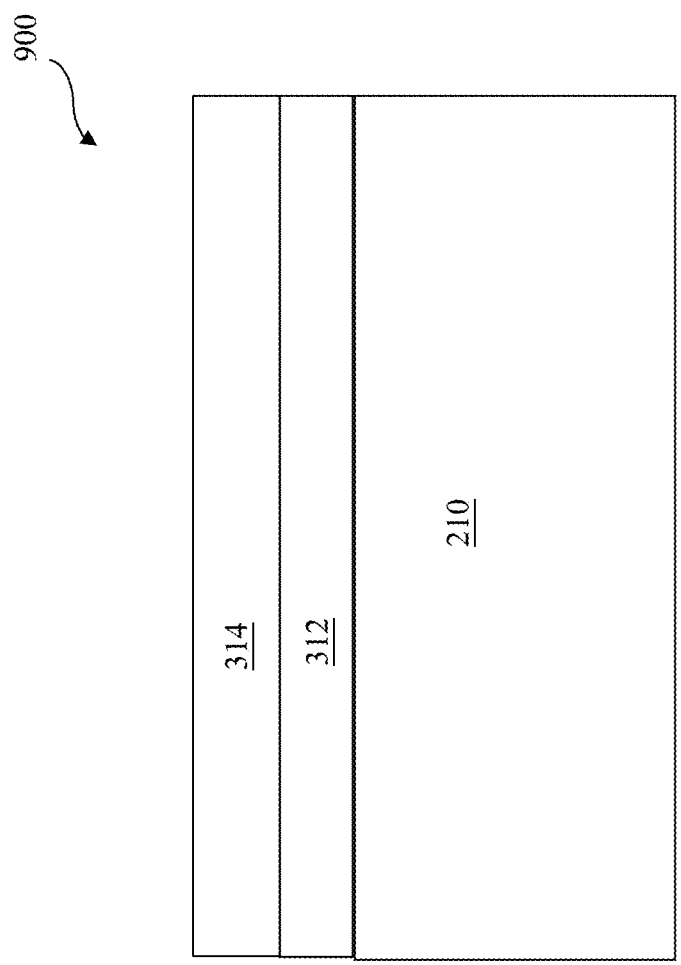
FIG. 9 is a cross-sectional view of another embodiment of a semiconductor substrate according to some embodiments of the present disclosure.

Referring now to FIG. 9, illustrated is a semiconductor device 900. The device 900 may include a substrate 210. The substrate 210 may be a semiconductor substrate such as a silicon substrate. In other embodiments, the semiconductor substrate 201, the substrate may alternatively or additionally include other suitable semiconductor material, such as germanium (Ge), silicon germanium (SiGe), silicon carbide (SiC), gallium arsenic (GaAs), diamond, indium arsenide (InAs), indium phosphide (InP), silicon germanium carbide (SiGeC), gallium indium phosphide (GaInP), and/or other suitable materials. The substrate 210 may have any number of features of semiconductor devices disposed thereon including those features associated with planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or other devices as known in the art. The substrate 210 may include other device such as MEMs devices, capacitors, resistors, image sensors, LCD devices, and/or other suitable devices.

The device 900 includes the layers 312 and 314, which may be substantially similar to as discussed above. For example, the layers 312 may include stresses that together, neutralize one another (e.g., compressive and tensile). The layers 312 and 314 may be patterned using photolithography methods including as discussed above. Additional layers may be formed on and/or under the layer 312 and 314, including as discussed above. In some embodiments, the layers 312 and 314, as discussed above, serve to reduce a cumulative stress introduced to the substrate 210, for example, providing for a relative 'flatness' of the substrate 210.

Based on the above, it can be seen that the present disclosure provide methods of forming a stack of film with minimized stress-induced adverse impacts on flatness of a substrate. The method employs form a pair of films, which has opposite stress type and same stress intensity (value). The method demonstrates suppressing film-stress-induced adverse impacts on flatness of the substrate. The method in some embodiments minimizes the overlay error caused by non-flatness of the substrate.

The present disclosure provides many different embodiments of fabricating a semiconductor device that provide one or more improvements over existing approaches. In one embodiment, a method for fabricating a semiconductor device includes forming a first film having a first film stress type and a first film stress intensity over a substrate and forming a second film having a second film stress type and a second film stress intensity over the first film. The second film stress type is different than the first film stress type. The second film stress intensity is about same as the first film stress intensity. The second film compensates stress induced effect of non-flatness of the substrate by the first film.

In yet another embodiment, a method includes providing a substrate having a imaging sensor element, forming a pair of films over the substrate. The pair of films has a first film having compressive stress and a first film stress intensity and a second film having tensile stress and a second film stress intensity. The second film stress intensity is about same as the first film stress intensity and the second film compensates stress induced effect of non-flatness of the substrate by the first film. The method also includes forming a patterned photoresist layer over the pair of films. The patterned photoresist layer has an opening aligns to the imaging sensor element. The method also includes etching the pair of films through the opening to form a trench and a pillar.

In yet another embodiment, a method includes forming a pair of films over the substrate. The pair of films has a first film having compressive stress and a first film stress intensity and a second film having tensile stress and a second film stress intensity over the first film. The second film stress intensity is about same as the first film stress intensity and the second film compensates stress induced effect of non-flatness of the substrate by the first film. The method also includes patterning the pair of films by lithography process and etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a metal grid over an image sensor device, wherein the metal grid includes an opening aligned with a light sensing region of the image sensor device, and further wherein the forming the metal grid includes:
      forming a first metal film consisting of a first metal having a first stress type over a substrate; and
      forming a second metal film consisting of a second metal having a second stress type over the first metal film, wherein the second stress type is different than the first stress type.

2. The method of claim 1, wherein the first stress type is a compressive stress, and the second stress type is a tensile stress.

3. The method of claim 1, wherein the first stress type is a tensile stress, and the second stress type is a compressive stress.

4. The method of claim 1, wherein the first metal and the second metal include tungsten.

5. The method of claim 1, wherein the first metal film is formed by physical vapor deposition, and the second metal film is formed by chemical vapor deposition.

6. The method of claim 1, further comprising:
   forming a patterned layer over the second metal film; and
   etching the second metal film and the first metal film using the patterned layer as a masking element.

7. The method of claim 1, wherein a value of a first stress intensity of the first metal film is within ±10% of a value of a second stress intensity of the second metal film.

8. A method comprising:
   forming a pair of metal films over a substrate that includes a plurality of image sensor elements, the pair of metal films having a first metal film consisting of a first metal with a compressive stress and a second metal film consisting of a second metal having tensile stress;
   forming a patterned resist layer over the pair of metal films, wherein the patterned resist layer has a plurality of openings, each of the plurality of openings aligned with a respective one of the plurality of image sensor elements; and
   etching the pair of metal films through the plurality of openings.

9. The method of claim 8, wherein the first metal film is formed over the substrate and the second metal film is formed directly on the first metal film.

10. The method of claim 8, wherein the first metal film is only one metal layer and the second metal film is only one metal layer.

11. The method of claim 8, wherein the first metal and the second metal are tungsten.

12. The method of claim 8, wherein the first metal film is formed by physical vapor deposition, and the second metal film is formed by chemical vapor deposition.

13. The method of claim 8, wherein before forming the pair of metal films, the method further comprising:
   forming an anti-reflection coating (ARC) layer over the substrate; and
   forming a dielectric layer over the ARC layer.

14. The method of claim 13, wherein the etching the pair of metal films through the plurality of openings includes etching a portion of the dielectric layer.

15. The method of claim 8, the method further comprising:
   forming a first dielectric layer over the substrate before forming the pair of metal films, such that the pair of metal films are disposed over the first dielectric layer;

forming a second dielectric layer in the plurality of openings after the etching of the pair of metal films; and forming a plurality of color filters and a plurality of microlenses over the second dielectric layer, wherein each of the plurality of color filters and each of the plurality of microlenses is aligned with a respective one of the plurality of image sensor elements.

16. A method comprising:

forming a metal layer stack that includes a first metal layer consisting of a first metal having a first stress type and a second metal layer consisting of a second metal having a second stress type, wherein the first stress type is opposite the second stress type; and patterning the metal layer stack to form an opening in the metal layer stack that is aligned with an image sensor element.

17. The method of claim 16, wherein a stress value of the first metal layer is within ±10% of a stress value of the second metal layer.

18. The method of claim 16, wherein the metal layer stack is configured to minimize an overlay error during subsequent processing.

19. The method of claim 16, wherein the first metal layer is formed by physical vapor deposition (PVD) and the second metal layer is formed by chemical vapor deposition (CVD).

20. The method of claim 16, wherein the first metal and the second metal are the same.

* * * * *